United States Patent [19]
Huijsing et al.

[11] Patent Number: 5,631,607
[45] Date of Patent: May 20, 1997

[54] COMPACT GM-CONTROL FOR CMOS RAIL-TO-RAIL INPUT STAGES BY REGULATING THE SUM OF THE GATE-SOURCE VOLTAGES CONSTANT

[75] Inventors: Johan H. Huijsing, Schipluiden; Ronald Hogervorst, Voorschoten, both of Netherlands; John Tero, Saratoga, Calif.

[73] Assignee: Philips Electronics North America Corporation, New York, N.Y.

[21] Appl. No.: 523,831

[22] Filed: Sep. 6, 1995

[51] Int. Cl.[6] .................................. H03F 3/45; H03F 3/16
[52] U.S. Cl. .......................... 330/253; 330/258; 330/261
[58] Field of Search .................................. 330/253, 258, 330/261

[56] References Cited

U.S. PATENT DOCUMENTS

| | | | |
|---|---|---|---|
| 4,780,688 | 10/1988 | Groom | 330/261 |
| 5,323,120 | 6/1994 | Ryat | 330/252 |
| 5,371,474 | 12/1994 | Wassenaar et al. | 330/258 X |
| 5,412,343 | 5/1995 | Rijns | 330/253 |

*Primary Examiner*—Steven Mottola
*Attorney, Agent, or Firm*—Steven R. Biren

[57] ABSTRACT

Compact $g_m$-control circuits for CMOS rail-to-rail input stages operating in strong inversion are provided. The $G_m$-control circuit makes the sum of the gate-source voltages of the complementary input transistors, and therefore the $g_m$ of the input stage constant. The compact $g_m$-control circuits implement a floating voltage source in the form of circuit elements between the N and P-channel input stage transistors and the positive and negative supply rails of the operational amplifier.

17 Claims, 9 Drawing Sheets

COMPACT GM-CONTROL FOR CMOS RAIL-TO-RAIL INPUT STAGES BY REGULATING THE SUM OF THE GATE-SOURCE VOLTAGES CONSTANT

BACKGROUND OF THE INVENTION

1. Field of the Invention

The present invention relates to operational amplifiers. More particularly, it relates to compact transconductance ($g_m$) control circuits for CMOS rail-to-rail input stages operating in strong inversion.

2. The Prior Art

Input stages of low-voltage amplifiers often have to be able to deal with rail-to-rail common-mode input voltages. To obtain a rail-to-rail common-mode input voltage swing, a P-type and N-type input pair can be placed in parallel.

The common mode input range of such a rail-to-rail input stage can be divided in to three parts: (1) Low common-mode input voltages (only the P-channel input pair operates), (2) Intermediate common-mode input voltages (both the P-channel and N-channel input pairs operate), and (3) High common-mode input voltages (only the N-channel input pair operates).

When the common-mode input voltage moves from one part of the common-mode input range into another, the transconductance ($g_m$) changes with a factor of 2. Since the unity-gain frequency of an amplifier is proportional to the unity-gain frequency of the input stage, this impedes optimal frequency compensation. In order to obtain the maximum unity-gain frequency over the whole common-mode input range, the $g_m$ of the input stage has to be constant.

U.S. Pat. No. 4,555,673 to Huijsing et al., discloses a differential amplifier with rail-to-rail input capability and controlled transconductance ($g_m$). The method employed for controlling the transconductance uses current control, or current switches, to steer at least part of the supply current away from at least one of the differential portions of the input stage when the common mode voltage is in at least one part of the supply range. As a MOS transistor operating under the weak inversion regime behaves like a bipolar transistor, the same techniques can be used for a MOS transistor operating in weak inversion.

In weak inversion, a constant-$g_m$ can also be obtained by using a minmax circuit (Botma, J. H., R. F. Wassenaar and R. J. Wiegerink, "*Simple rail-to-rail constant-transconductance CMOS input stage in weak inversion*", Electronic Letters, No. 12, pp 1145–1146, June 1993). However, in many applications, such as high-slew rate or high bandwidth, the $g_m$ of an input transistor operating in weak inversion is too small. If the input pairs operate in strong inversion, its $g_m$ can be larger.

Existing constant $g_m$-control of an input stage operating in strong inversion use square root circuits (Botma, J. H., et al., "*A low-voltage CMOS operational amplifier with rail-to-rail constant-gm input stage and class-AB rail-to-rail output stage*", Proceeding ISCAS93, pp.1314–1317), or three times current mirrors (Hogervorst, R. et al., "*CMOS low-voltage operational amplifiers with constant-gm rail-to-rail input stage*", Proceedings ISCAS92, pp.2876–2879). The $g_m$-control with three-times current mirrors can form a positive feedback loop at very low supply voltages. This effect can be avoided by using an additional protection circuit. (R. Hogervorst, J. P. Tero, R. G. H. Eschauzier, J. H. Huijsing, "*A compact power-efficient rail-to-rail input/output amplifier for VLSI cell libraries*". in Digest ISSCC94, February 1994).

The minmax $g_m$-control circuit, which is used in rail-to-rail input stages operating in weak inversion, can easily be adapted to input stages operating in strong inversion, by choosing the width (W) to length (L) ratio of the $g_m$-control transistors 3-times larger than the input transistors.

These existing gm-control techniques have their own drawbacks. Some are designed for weak inversion and therefore are not appropriate for strong inversion. In strong inversion, three-times current mirrors, minmax circuits or square-root circuits can be used. Three-times current mirrors and minmax circuits still display a 15% variation over the common-mode input range. In addition, the $g_m$-control with three times current mirrors can form a positive feedback loop at low-supply voltages. Square root circuits display lower variation of the $g_m$, however, these types of circuits tend to be complex, and as such, occupy a large amount of die area.

Therefore, it is desirable to have a transconductance ($g_m$) control circuit for rail-to-rail input stages operating in strong inversion that is compact in design, and maintains the $g_m$ of the input stage constant over the whole common-mode input range. The more compact the design, the less die area that will be required. It is also desirable to have a control circuit which is robust against parameter variations, such as supply voltage variations.

SUMMARY OF THE INVENTION

A compact $g_m$-control circuit is provided whereby a floating voltage source is added between the complementary differential input pairs of transistors. The floating voltage source maintains the sum of the gate-source voltages of the input pairs, and therefore the $g_m$, constant. In addition, the floating voltage source also provides the tail currents and thereby the power to the input pairs. Thus, the $g_m$ is maintained constant. The implementation of a floating voltage source "on chip" can take many forms as will be shown.

It is therefore an object of the present invention to provide a compact $g_m$-control circuit for CMOS rail-to-rail input stages operating in strong inversion that is small in design such that less die area is required.

It is yet another object of the invention to provide a compact $g_m$-control circuit that is inherently stable throughout the entire common-mode input range.

Another object of the invention is to provide a compact $g_m$-control circuit that is simple and economical to manufacture.

It is another object of the invention to provide a compact $g_m$-control circuit that operates efficiently and reliably.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings:

FIG. 5 is a graphical representation of the normalized $g_m$ versus the common-mode input voltage for the circuit of FIG. 4a;

DETAILED DESCRIPTION OF PREFERRED EMBODIMENTS

Figure 1:
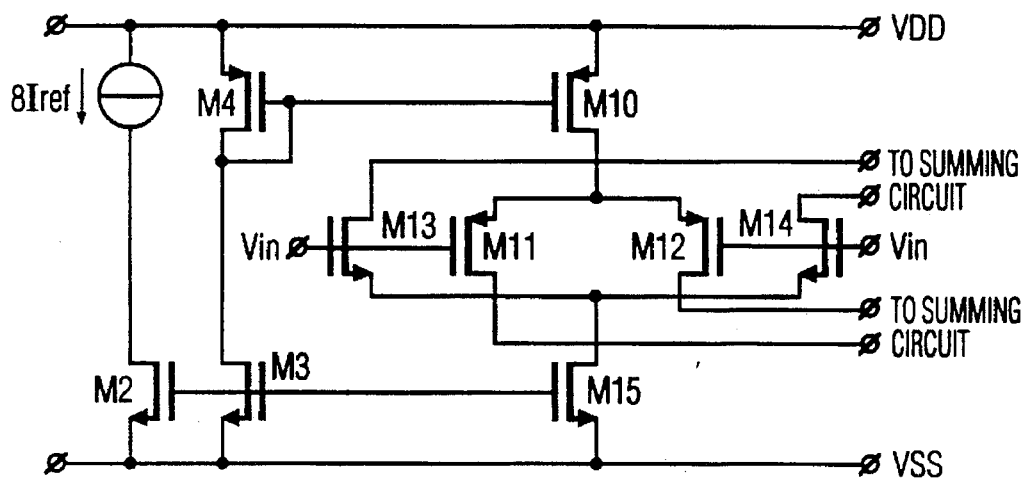
FIG. 1 is a schematic diagram of a rail-to-rail input stage of an operational amplifier of the prior art.

FIG. 1 shows an example of an input stage of an operational amplifier of the prior art. As shown, the input stage has a rail-to-rail common-mode input range which can be composed of two complementary differential input pairs. The input stage consists of an N-channel input pair, M13–M14, and a P-channel input pair, M11–M12. The common-mode input voltage range for such an input stage can be divided into three parts: (1) Low common-mode input voltages (only the P-channel input pair operates); (2) Intermediate common-mode input voltages; (both the P-channel and N-channel input pair operate); and, (3) High common-mode input voltages (only the N-channel input pair operates).

When the common-mode input voltage moves from one part of the common-mode input range into another, the transconductance ($g_m$) changes with a factor of two (2). Thus, since the unity-gain frequency of an amplifier is proportional to the $g_m$ of the input stage, changes in the $g_m$ impedes an optimal frequency compensation. Therefore, in order to obtain optimal frequency compensation over the whole common-mode input range, the $g_m$ of the input stage must be constant.

Figure 2:
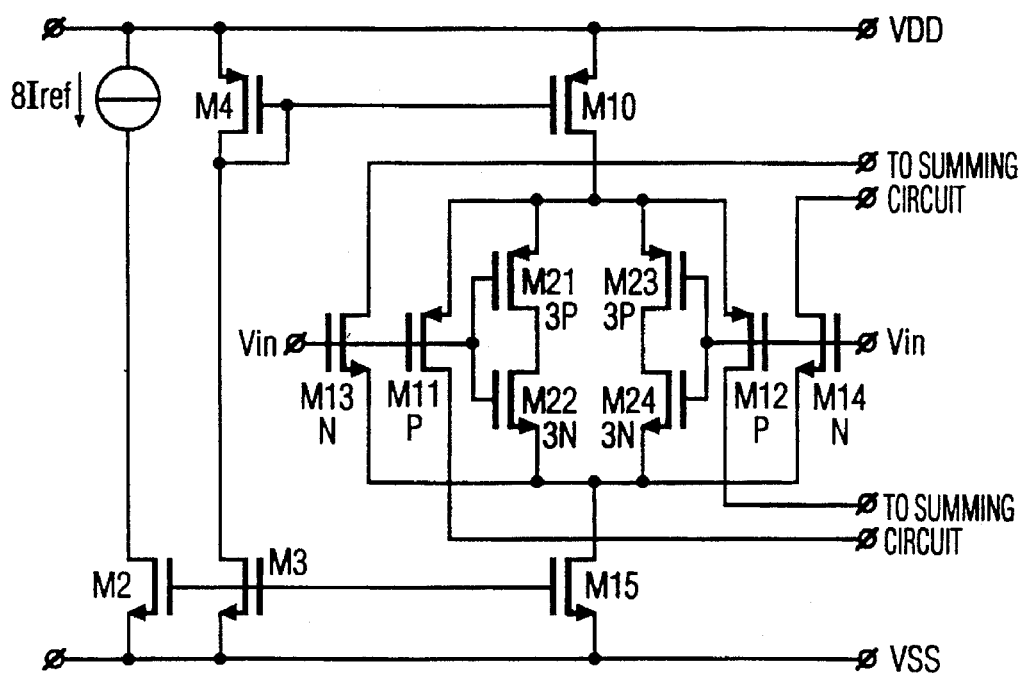
FIG. 2 is a schematic diagram of a rail-to-rail input stage with a minmax $g_m$-control circuit of the prior art.

FIG. 2 shows an example of the prior art rail-to-rail input stage with a minmax $g_m$-control circuit. The minmax $g_m$-control circuit can be easily adapted to input stages operating in strong inversion, and by choosing the Width (W) over Length (L) ratio of the $g_m$-control transistors, M21–24, three (3) times larger than the input transistors instead of 1, as shown. The N and P values shown are the W over L ratio for the N-channel and a P-channel input transistor, respectively.

Using the well-known quadratic model for a MOS transistor that operates in strong inversion, the $g_m$ of the rail-to-rail input stage can be calculated. For each part of the common-mode input range, it is given by:

$$g_m = 4\sqrt{KI_{ref}} \qquad (1)$$

Figure 3:
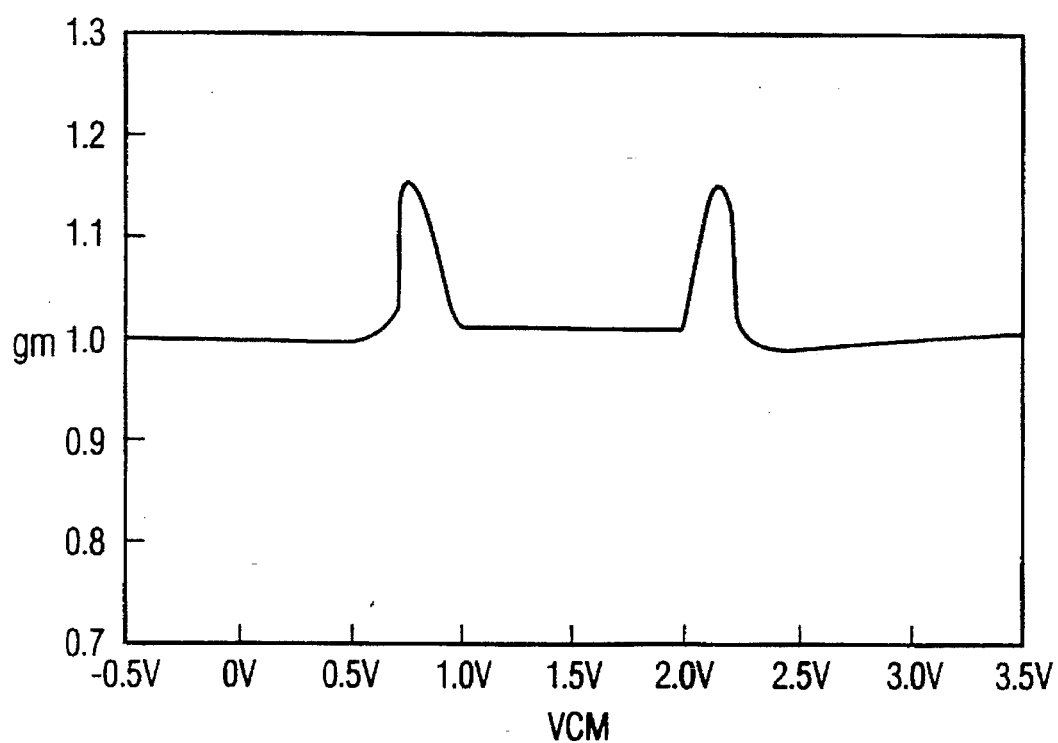
FIG. 3 is a graphical representation of the normalized $g_m$ versus the common-mode input voltage for the circuit of FIG. 2.

FIG. 3 shows the normalized $g_m$ versus the common-mode input voltage for the minmax $g_m$-control circuit of FIG. 2. Thus, it can easily be concluded that the $g_m$ is constant over the entire common-mode input range, except for two transition regions. In these transition regions the current through each pair of $g_m$-control transistors gradually increases from 0 to 3 $I_{ref}$, or vice versa. The result is a 15% variation of the $g_m$. This variation is the same as the variation of the $g_m$ for input stage with three-times current switches. However, the minmax $g_m$-control is inherently stable, which offers advantages above the aforementioned $g_m$-control with three-times current mirrors.

Figure 4A:
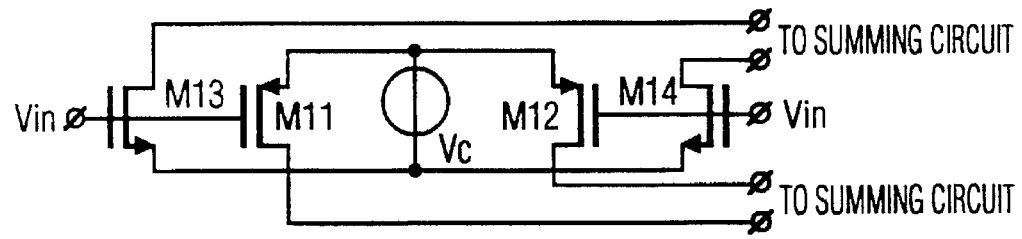
FIG. 4a is a schematic diagram of the basic principle of the compact $g_m$-control circuit according to the invention.

FIG. 4a is the leading figure of the disclosure and shows the basic principle of the compact $g_m$-control circuit according to the invention. A floating constant voltage-source $V_c$ has been added to the complementary input stage M11–M14 which is operating in strong inversion. Voltage source $V_c$ is an active device because it also provides the tail-currents, and therefore the power to the input pairs. Voltage source $V_c$ keeps the sum of the gate-source voltages of the input transistors M11–M14, and therefore the $g_m$ of the rail-to-rail input stage, constant. The voltage source $V_c$ has a value of:

$$V_C = V_{TN} + V_{TP} + 2\sqrt{\frac{I_{ref}}{K}} \qquad (2)$$

where $$K = \frac{1}{2}\mu_P C_{ox}\left(\frac{W}{L}\right)_P = \frac{1}{2}\mu_N C_{ox}\left(\frac{W}{L}\right)_N \qquad (3)$$

and $\mu$ is the mobility of the charge carriers, $C_{ox}$ is the normalized oxide capacitance, W and L are the width and the length of an input transistor, respectively. The subscripts N and P refer to a N-channel and P-channel input transistors, respectively. $V_{TN}$ and $V_{TP}$ are the threshold voltages of the N-channel and P-channel transistors, respectively. Now it can be calculated by using the well known square law model, that the $g_m$ of the rail-to-rail input stage is given by:

$$g_m = 4\sqrt{KI_{ref}} \qquad (4)$$

Figure 5:
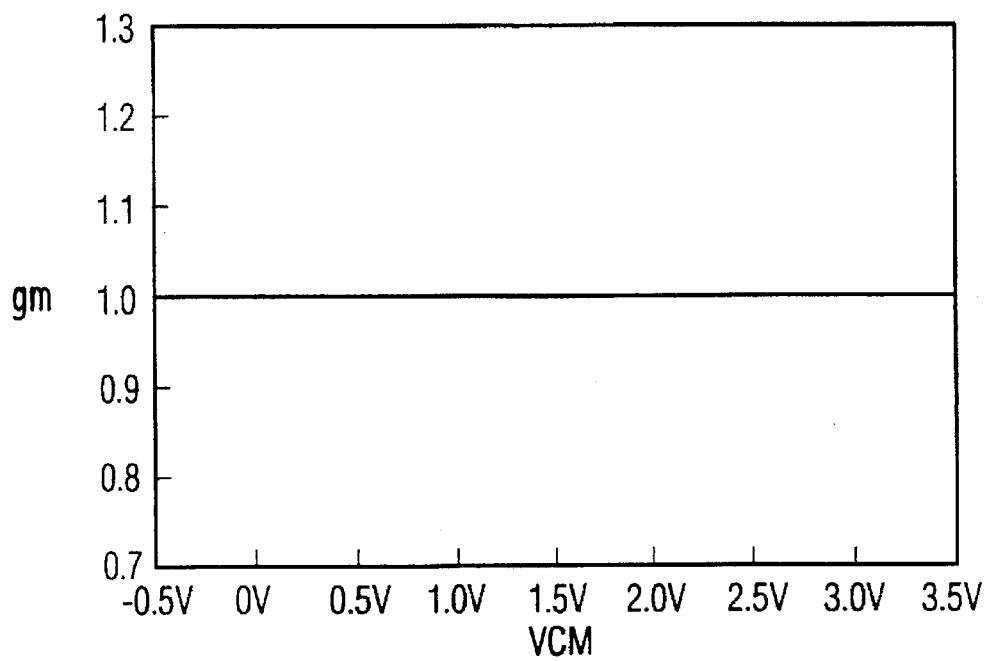

FIG. 5 shows the normalized $g_m$ of the rail-to-rail input stage versus the common-mode input range for the circuit of FIG. 4a. The transconductance ($g_m$) is constant for the entire common-mode input range. However, since floating voltage-sources are difficult to realize on chip, the circuit of FIG. 4a must be modified.

Figure 4B:
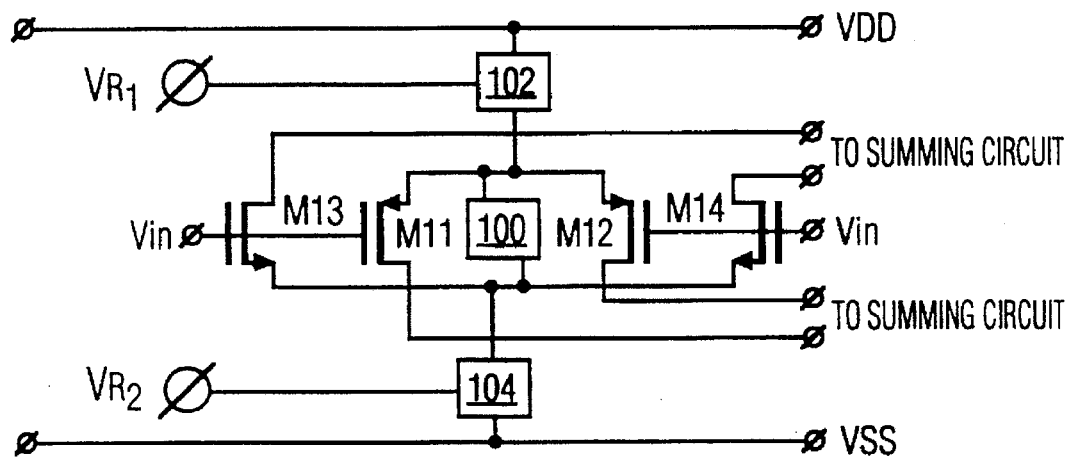
FIG. 4b is a schematic block diagram of the compact $g_m$-control circuit according to the invention.

FIG. 4b shows the implementation of the voltage source $V_c$ via control circuits 100, 102 and 104 added to the complimentary input stage M11–M14. Control nodes $V_{R1}$ and $V_{R2}$ provide the requisite reference signals for the circuit. Control circuits 100, 102, and 104 control the gate-source voltages of the input transistors and thereby maintain the $g_m$ of the rail-to-rail input stage constant, in addition to providing the needed stability to the circuit without significantly increasing the size thereof.

Figure 6:
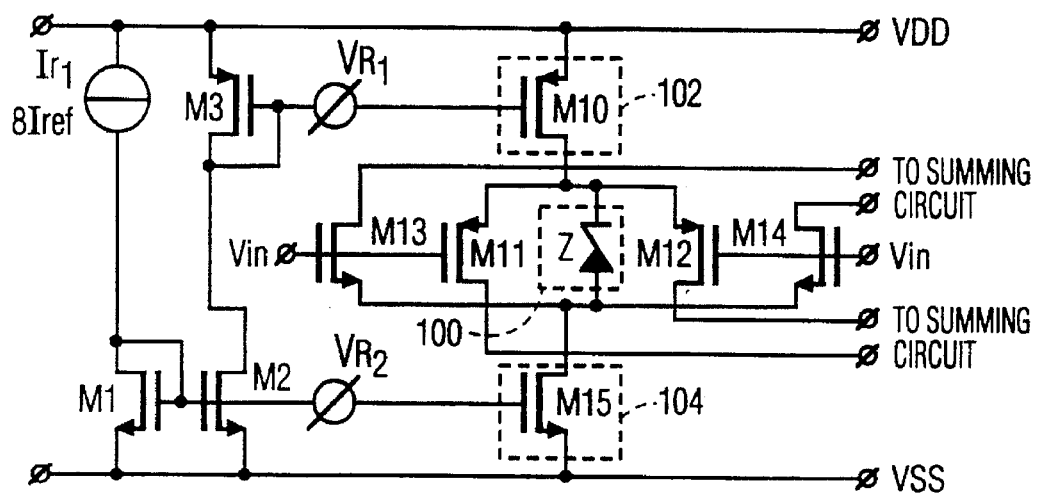
FIG. 6 is a schematic diagram of a first embodiment of the compact $g_m$-control circuit according to the invention.

FIG. 6 shows a version of the circuit of FIG. 4b where control circuit 100 consists of an ideal zener Z and circuits 102 and 104 are current sources M10 and M15, respectively. The current source $I_{R1}$, together with M1, M2, M3 provide the requisite reference signals for the circuit. The zener Z keeps the sum of the gate-source voltages of the input transistors M11–M14, and therefore the $g_m$ constant. Assuming zener Z has a value of:

$$V_C = V_{TN} + V_{TP} + 2\sqrt{\frac{I_{ref}}{K}} \qquad (5)$$

It can be calculated that the $g_m$ of the rail-to-rail input stage is given by equation (4). The principles of the circuit of FIG. 6 can best be understood by dividing the common-mode input ranges into its respective three parts: (1) If low common-mode input voltages are applied, only the P-channel input pair M11, M12 operates. In this range, the current through zener Z is zero, and as such, the tail-current of the P-channel input pair M11, M12 is 8 $I_{ref}$; (2) If intermediate common-mode voltages are applied, both the P-channel and N-channel pairs operate. In this range, the sum of the gate-source voltages is equal to the voltage across zener Z. The current through zener Z will be equal to 6 $I_{ref}$. The result is that the tail current of both input pairs is equal to 2 $I_{ref}$; (3) If high common-mode input voltages are applied, only the N-channel input pair M13, M14 operates. In this range, the current through zener Z is zero and the tail-current of the N-channel input pair equals 8 $I_{ref}$. It can therefore be calculated that the $g_m$ is constant over the whole common-mode input range and that it is given by:

$$g_m = 4\sqrt{KI_{ref}} \qquad (6)$$

Figure 7:
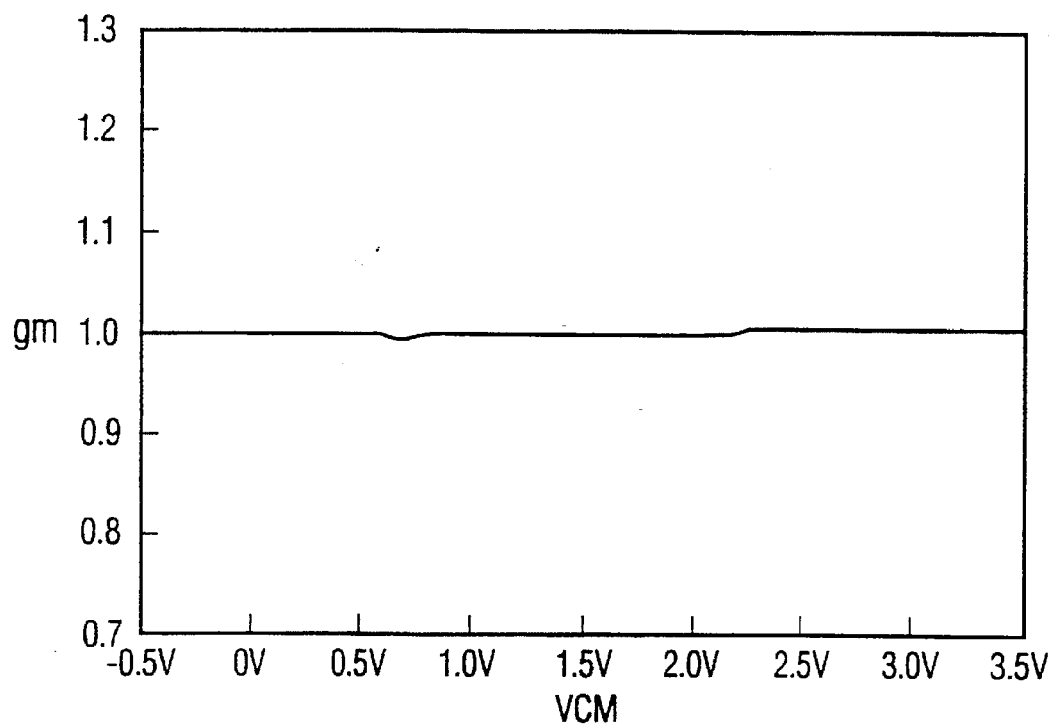
FIG. 7 is a graphical representation of the normalized $g_m$ versus the common-mode input voltage for the circuit of FIG. 6.

FIG. 7 shows the normalized $g_m$ as a function of common-mode input range for the circuit of FIG. 6. The $g_m$ is constant over the entire common-mode input range with only a slight variation in the transition regions. The transition regions being defined where the current through zener Z varies from zero to 6 $I_{ref}$ and vice versa.

Figure 8:
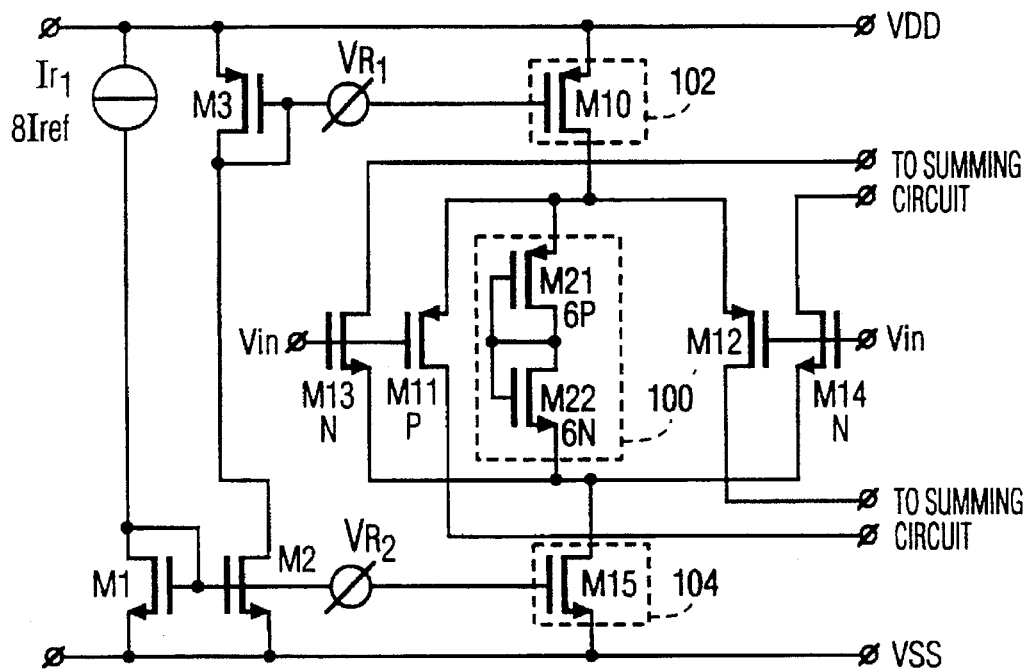
FIG. 8 is a schematic diagram of the second embodiment of the compact $g_m$-control circuit according to the invention.

FIG. 8 shows the complementary input stage of FIG. 6 where the control circuit 100 is implemented by means of two diode-connected transistors M21 and M22. Diodes M21 and M22 maintain the sum of the gate-source voltages of the input pairs M11–M14 constant. Current source $I_{R1}$, together with M1, M2 and M3 provide the requisite reference signals to the circuit. The N and P values are the Width (W) over Length (L) ratios of the N-channel and P-channel transistors, respectively.

Referring to FIG. 8, (1) if low common-mode input voltages are applied, only the P-channel input pair M11, M12 operates. In this range, the current through diodes M21 and M22 is zero, and the tail current of the P-channel input pair is equal to 8 $I_{ref}$; (2) If intermediate common-mode input voltages are applied, both the P-channel and the N-channel input pair operate. Since the widths of the diode-connected transistors M21, M22 are six (6) times the width of the input transistors, the current through diodes M21 and M22 is equal to 6 $I_{ref}$. The result is that the tail-currents of both input pairs are equal to 2 $I_{ref}$; (3) If high common-mode input voltages are applied, only the N-channel input pair M13, M14 operates. In this range, the current through the diode connected transistors M21 and M22 is zero. Thus, it can be concluded that the tail-current of the N-channel input pair M13, M14 is equal to 8 $I_{ref}$.

Again, it can be calculated that for each part of the common-mode input range, the $g_m$ is given by:

$$g_m = 4\sqrt{KI_{ref}} \qquad (7)$$

Figure 9:
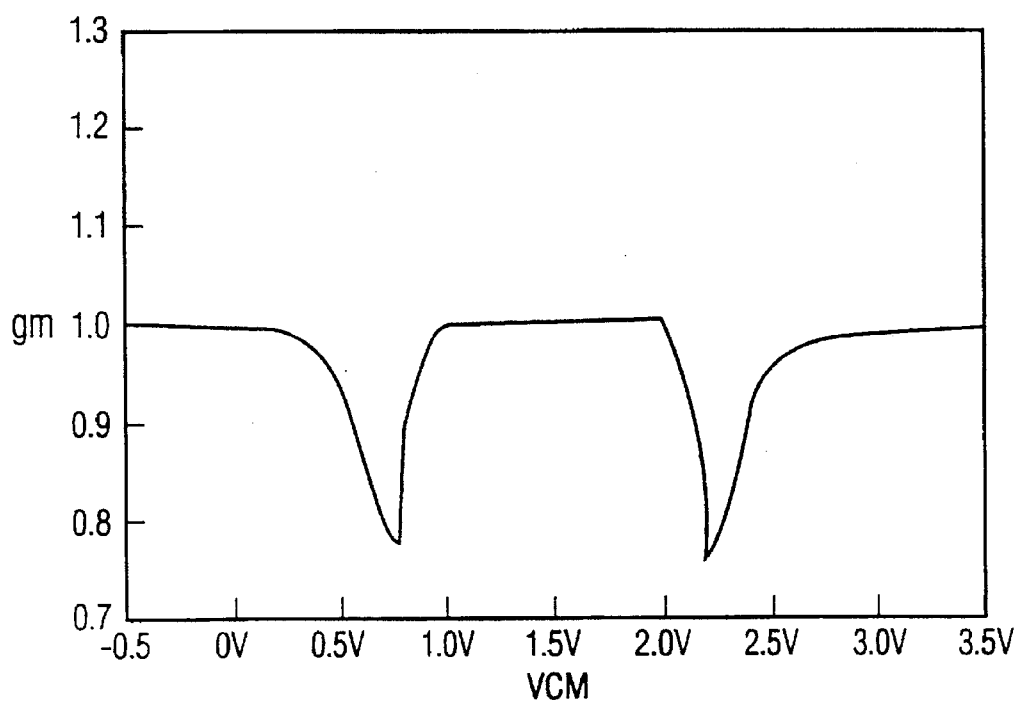
FIG. 9 is a graphical representation of the normalized $g_m$ versus the common-mode input voltage for the circuit of FIG. 8.

FIG. 9 shows the normalized $g_m$ versus the common-mode input range for the circuit of FIG. 8. Thus, it can be concluded that the $g_m$ is constant over the common-mode input range, except for two transition regions. In these transition regions, the current through the diodes M21, M22 gradually changes from 0 to 6 $I_{ref}$, or vice versa. The result is a 23% variation of the $g_m$. This variation of the $g_m$ in the transition regions can be decreased by adding more gain to the $g_m$-control circuit.

Figure 10:
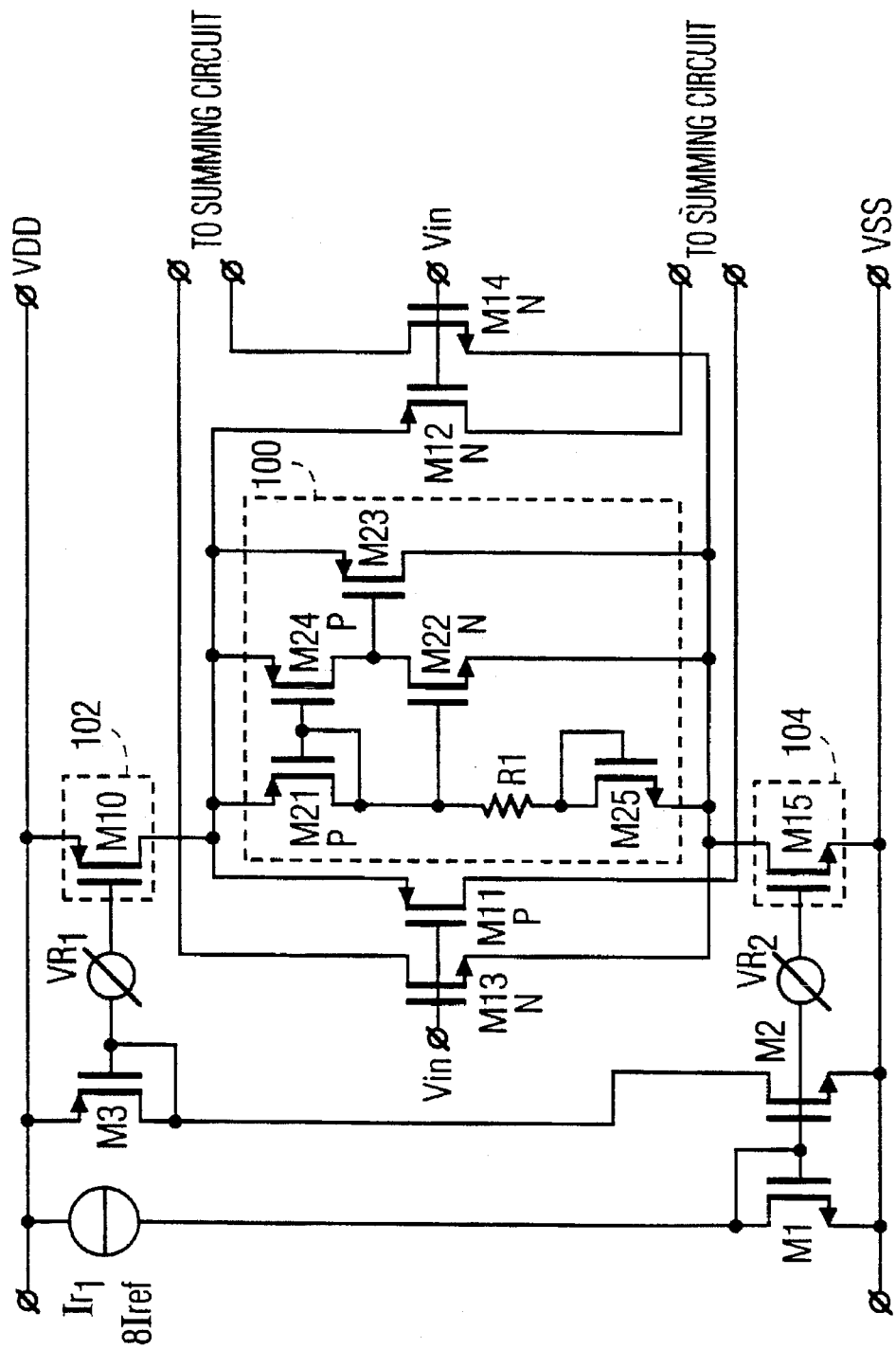
FIG. 10 is a schematic diagram of a third embodiment of the compact $g_m$-control circuit according to the invention.

FIG. 10 shows another alternative embodiment for the compact $g_m$-control according to the invention. The control circuit 100 is implemented by means of transistors M21–M25 and resistor R1. Diode-connected transistors M21 and M25 together with R1 form a reference chain. The voltage across this reference chain is determined by the W over L ratios of M21 and M25, the value of R1, and the current through the chain. This current is set by M22, M25 and the value of R1. M21 and M24 bias M22 and M25 at the same current level. Since M25 and M22 have different aspect ratios, a voltage difference will occur across resistor R1, which will result in a current through the reference chain. M24 can also be a scaled version of M21. Under this circumstance, the current through M22 and M25 is not equal, and as such, the scaling between M25 and M22 would need to be adapted accordingly. Current source $I_{R1}$, together with M1–M3 provide the requisite reference signals for the circuit.

The principles of the $g_m$-control circuit of FIG. 10 can best be understood by dividing the common-mode input range into three parts: (1) If low common-mode input voltages are applied, only the P-channel input pair operates. In this range, the voltage across M21, M25 and R1 is too small to start the reference chain, and thus the current through the chain equals zero. The result is that the current through M22 and M23 is zero, and the tail current of the P-channel input pair M11, M12 is equal to 8 $I_{ref}$; (2) If intermediate common-mode input voltages are applied, both the P-channel and N-channel input pair operate. In this range, the sum of the gate-source voltages of the input pairs is equal to the voltage across the reference chain M21, M25 and R1. The reference chain sets the drain current of M21, M25 and M22 equal to $I_{ref}$. The two branches with M21 and M22 take away 2 $I_{ref}$ from the current sources M15 and M10. Consequently, the current through M23 is controlled at a value of 4 $I_{ref}$. The result is that the tail-currents of both input pairs are equal to 2 $I_{ref}$; (3) If high common-mode input voltages are applied, only the N-channel input pair operates. In this range, the current through the reference chain, and therefore the current through M22 and M23 is zero. Thus, it can be concluded that the tail-current of the N-channel input pair is equal to 8 $I_{ref}$. Again, for each part of the common-mode input range, the $g_m$ can be calculated by equation (7).

Figure 11:
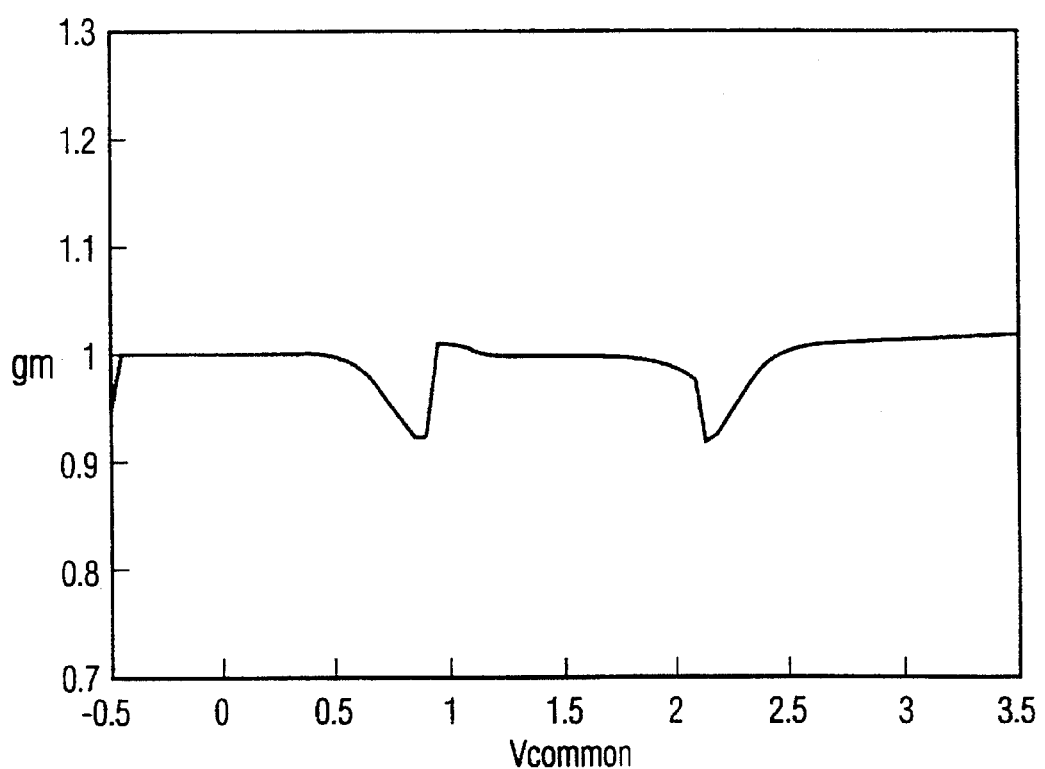
FIG. 11 is a graphical representation of the normalized $g_m$ versus the common-mode input voltage for the circuit of FIG. 10.

FIG. 11 shows the normalized $g_m$ versus the common-mode input range for the circuit of FIG. 10. Again, the $g_m$ is constant over the entire common-mode input range, except for the two transition regions. In these transition regions, the current through transistor M23 gradually changes from 0 to 4 $I_{ref}$, or vice versa. The result is a 8% variation of the $g_m$, which is due to the fact that the voltage across the electronic control circuit 100 is slightly current dependent. The main advantage of this $g_m$-control circuit is that is it is very simple and completely self-biasing.

One drawback of the $g_m$-control circuit of FIG. 10 is that resistor R1 is required to set up the reference chain. Unfortunately, resistors can occupy a considerable amount of die area and therefore result in a larger circuit. The circuit of FIG. 12 addresses this problem and implements control circuit 100 by means of transistors M21–M23, M25 and M28. As a result, the gain of this circuit is larger, thereby resulting in a smaller variation of the $g_m$ within the transition regions. The diode-connected transistor M21, together with the two transistors M22–M23, keep the sum of the gate-source voltages, and therefore the $g_m$ of the input pairs M11–M14 constant.

The diode-connected transistors M21 and M25 form a reference chain. The voltage across the reference chain is set by the W over L ratios of the diode-connected transistors and the current through M22. M22 and M23 form the two transistor gain stages. Transistor M22 is biased by the constant current source M27, which has a value of $I_{ref}$. Current source M26 drains the current of M27. The transistor stage M23 controls the tail-current, and therefore the gate-source voltages of the input pairs. If the gate voltage of M23 exceeds a certain value, which is determined by $V_{bias}$ and M28, the folded cascode M28 takes away the current M27 and feeds it into the drain of M26. In this way, an additional variation of the $g_m$ is prevented at the upper part of the common-mode input range. $V_{bias}$ is chosen such that M27 is always biased in its saturated region. In addition, M27 is maintained in the saturated region by the fact that M28 limits the drain voltage of M27.

Figure 12:
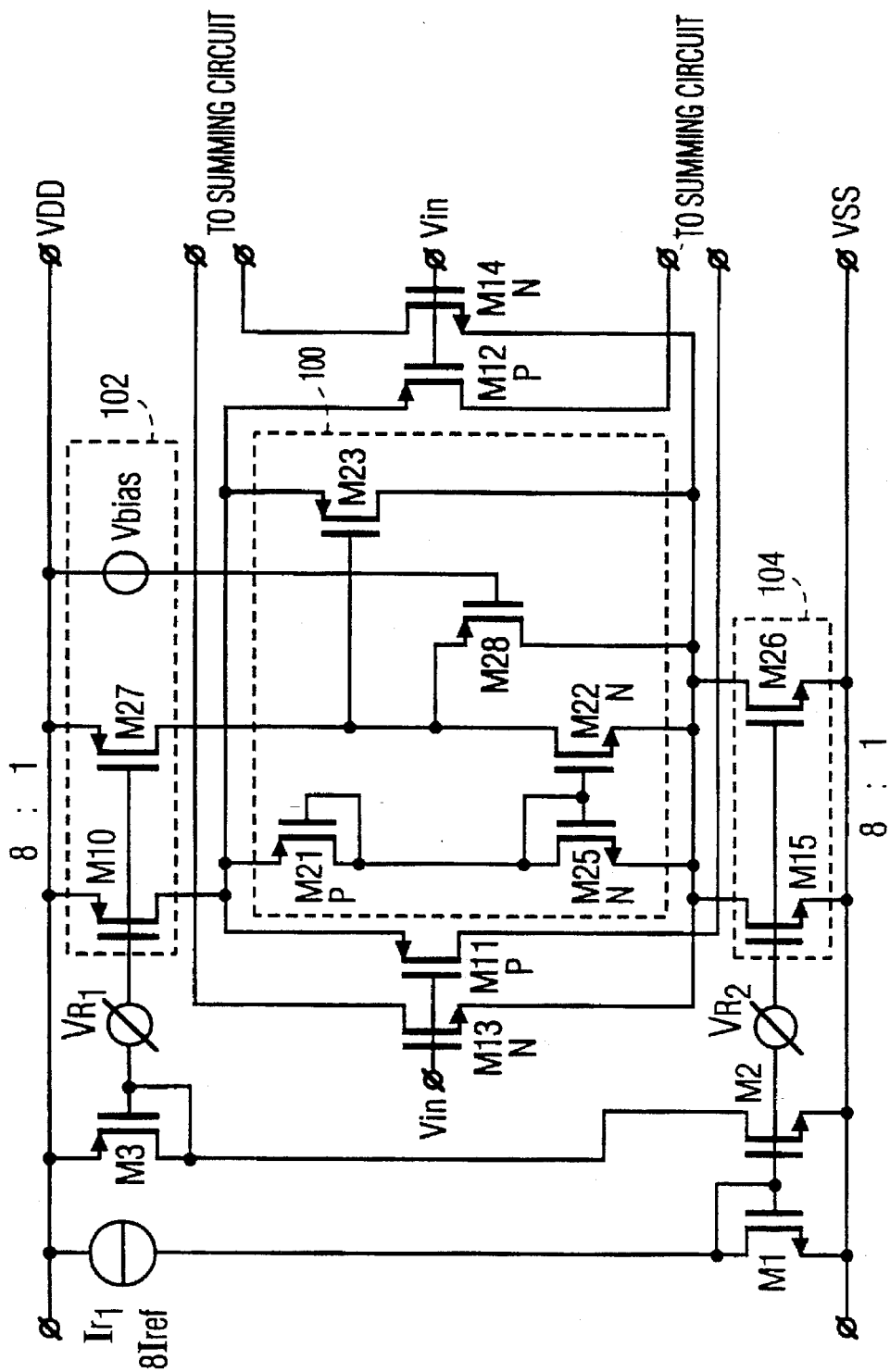
FIG. 12 is a schematic diagram of a fourth embodiment of the compact $g_m$ control circuit according to the invention.

The principles of the circuit of FIG. 12 are best understood by dividing the common-mode input range into three parts: (1) If low common-mode input voltages are applied, only the P-channel input pair operates. In this range, the current through the reference chain M21 and M25, and transistor M23 is zero. M28 takes away the current of M27 and feeds it into drain of M26. Thus, the tail-current of the P-channel input pair M11, M12 is equal to 8 $I_{ref}$; (2) If intermediate common-mode input voltages are applied, both the P-channel and N-channel input pairs operate. In this range, the sum of the gate-source voltages of the input pairs is set to the voltage across the reference chain M21, M25. In this range, M27 biases M22, and the current through M22 is equal to $I_{ref}$. Since M21 and M25 have the same W over L ratio as the input transistors, the current in the reference chain is set to $I_{ref}$. Consequently, the current through M23 is regulated at 5 $I_{ref}$. The result is that the tail-currents of both input pairs are equal to 2 $I_{ref}$; (3) If high common-mode input voltages are applied, only the N-channel input pair operates. In this range, the current through the reference chain, and transistors M22 and M23 is zero. M28 takes away the current of M27 and feeds it to drain of M26, and the tail-current of the N-channel input pair M13, M14 is equal to 8 $I_{ref}$. Again, equation (7) can be used to calculate the $g_m$ for each part of the common-mode input range.

In another embodiment of the invention, not shown, it is also possible to bias diode connected transistor M21 with an external current source. This external current source should be connected between the drain/gate of M21 and ground. In order to drain away this current, a second current source would need to be added. The second current source is connected between the positive supply rail and the source of M21.

Figure 13:
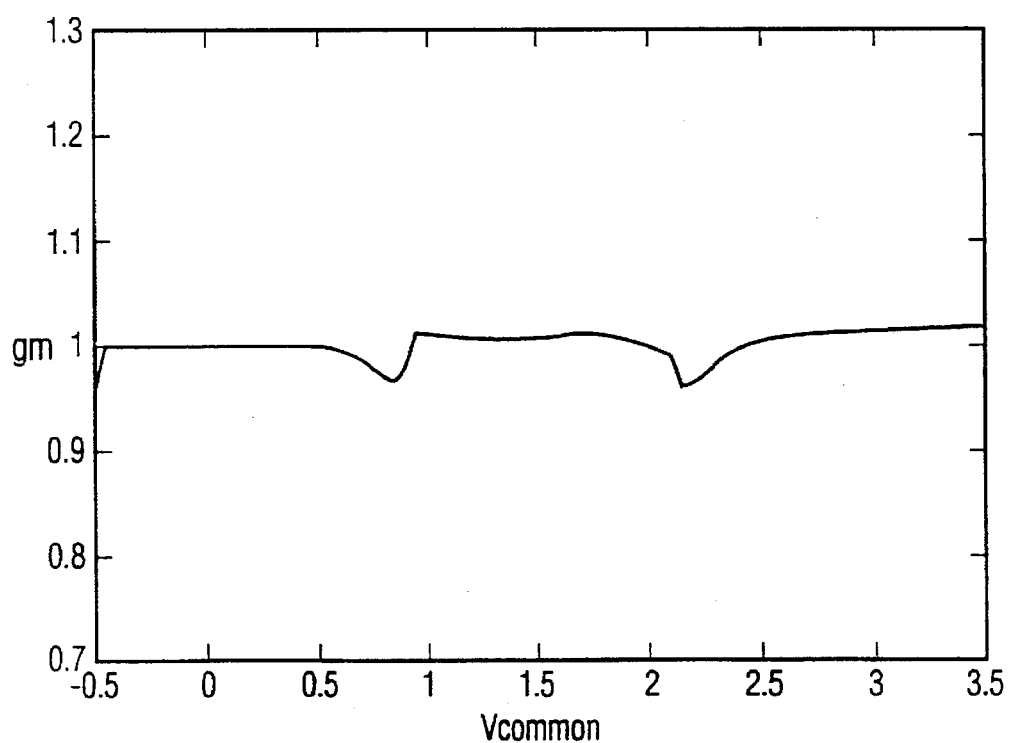
FIG. 13 is a graphical representation of the normalized $g_m$ versus the common-mode input voltage for the circuit of FIG. 12.

FIG. 13 shows the normalized $g_m$ for the common-mode input range. Again, the $g_m$ is constant over the entire range except for the two transition regions. In these regions the current through transistor M23 gradually changes from 0 to 5 $I_{ref}$.

While several embodiments of the present invention has been shown and described, it is to be understood that many changes and modifications may be made thereunto without departing from the spirit and scope of the invention as defined in the appended claims.

What is claimed is:

1. A circuit for controlling the transconductance (gm) of the rail-to-rail input stage of an operational amplifier (opamp) operating in strong inversion, the input stage having at least an N-channel and a P-channel differential input pair of transistors each having a tail current and a gate-source voltage, one gate of each pair being connected to one input terminal, the other gate of each pair being connected to the other input terminal, the sources of the N-channel pair being connected to the common N-tail, the sources of the P-channel pair being connected to the common P-tail, the opamp having a common-mode input voltage range including low, intermediate, and high common-mode input voltages, the input voltage range having transition regions between the low and intermediate, and the intermediate and high common-mode input voltage values, the circuit comprising:

control means coupled to the common tails of the differential input stage of the operational amplifier and the positive and negative supply rails for directly maintaining the sum of the gate-source voltages between the tails of the input pairs constant, said control means including active devices so as to provide the tail currents to the differential input pairs.

2. The circuit according to claim 1, wherein said control means comprises a floating constant voltage source.

3. The circuit according to claim 2, wherein said floating constant voltage source comprises:

a first circuit electrically coupled to the tails of the differential input stage of the operational amplifier;

a second circuit electrically coupled to one of the supply rails and the tail of one differential input stage of the amplifier;

a third circuit electrically coupled to the other of the supply rails and the tail of the other differential input stage of the amplifier; and reference means coupled to said second and third circuits for providing reference signals to said circuits.

4. The circuit according to claim 3, wherein said first circuit comprises a Zener diode and said second and third circuits comprise current sources.

5. The circuit according to claim 3, wherein said first circuit comprises two diode-connected transistors connected in series with each other.

6. The circuit according to claim 5, wherein said second and third circuits each comprise a current source.

7. The circuit according to claim 3, wherein said first circuit comprises:

a floating reference chain circuit for providing reference signals; and a floating gain circuit coupled with said reference chain circuit and the differential input stage for increasing the gain within said first circuit for increased stabilization of the voltage between the tails, and thereby reducing the variation of the $g_m$ within the transition regions of the common-mode input range.

8. The circuit according to claim 7, wherein said second and third circuits each comprise a current source.

9. The circuit according to claim 8, wherein said floating reference chain circuit comprises a first diode-connected transistor, a resistor and a second diode-connected transistor connected in series.

10. The circuit according to claim 9, wherein said floating gain circuit comprises:

a first transistor having its gate coupled to the gate of said first diode-connected transistor in said reference chain and its source coupled to one tail of the differential input stage;

a second transistor having its drain coupled to the drain of said first transistor, its gate coupled to the gate of the first transistor in said reference chain and its source coupled to the other tail of the differential input stage;

a control transistor having its drain and source coupled to the tails of the differential input stage, and having its gate coupled to the common drain connection of said first and second transistors; and whereby said reference chain and said gain stage circuit control the tail-currents and thereby maintain the sum of the gate-source voltages of the differential input stage transistors constant over the entire common-mode input range.

11. The circuit according to claim 3, wherein said first circuit comprises:

a floating reference chain circuit for providing a reference signal;

a gain circuit coupled with said reference chain circuit and the differential input stage for increasing the gain within said first circuit for increased stabilization of the voltage between the tails, and thereby reducing the variation of the $g_m$ within the transition regions of the common-mode input range; and a control transistor coupled with said gain stage, said second circuit and the differential input stage for proper operation of said circuit.

12. The circuit according to claim 11, wherein said second circuit comprises:

a first current source and a second current source connected to one of said tails and said gain stage.

13. The circuit according to claim 12, wherein said third circuit comprises:

a first current source and a second current source connected in parallel with each other to the other of said tails.

14. The circuit according to claim 13, wherein said reference chain circuit comprises a first and a second diode-connected transistor connected in series with each other and coupled between said tails of the differential input stage of the amplifier.

15. The circuit according to claim 14, wherein said gain stage circuit comprises:

a first transistor having its gate coupled to the gate of said second diode-connected transistor in said reference chain, its drain coupled to said second circuit, and its source coupled to said tail of the differential input stage;

a control transistor having its gate coupled to the drain of said first transistor and its drain and source coupled between the tails of the differential input stage.

16. A method for controlling the transconductance (gm) of the rail-to-rail input stage of an operational amplifier (opamp) operating in strong inversion, the input stage having at least an N-channel and a P-channel input differential pair of transistors each having a tail current and a gate-source voltage, the opamp having a common-mode input voltage range including low, intermediate, and high common-mode input voltages, the input voltage range having transition regions between the low and intermediate, and the intermediate and high common-mode input voltage values, the method comprising the step of:

directly maintaining the sum of the gate-source voltages of the input pairs constant throughout the entire common-mode input voltage range.

17. The method according to claim 16, wherein said step of maintaining the gate-source voltages constant is performed by a control circuit electrically coupled to the differential input pairs and both of the supply rails of the operational amplifier.

* * * * *